US007049045B2

(12) United States Patent
Kitson et al.

(10) Patent No.: US 7,049,045 B2
(45) Date of Patent: May 23, 2006

(54) MULTILAYER IMAGEABLE ELEMENTS

(75) Inventors: Paul Kitson, Evans, CO (US); Kevin B. Ray, Fort Collins, CO (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 372 days.

(21) Appl. No.: 10/641,888

(22) Filed: Aug. 14, 2003

(65) Prior Publication Data

US 2005/0037292 A1 Feb. 17, 2005

(51) Int. Cl.
*G03F 7/11* (2006.01)

(52) U.S. Cl. ................................ 430/270.1; 430/273.1; 430/302; 430/306; 430/309; 430/401; 430/434; 430/494; 430/944; 430/945

(58) Field of Classification Search .............. 430/270.1, 430/271.1, 273.1, 302, 306, 309, 401, 434, 430/494, 944, 945
See application file for complete search history.

(56) References Cited

U.S. PATENT DOCUMENTS

| | | | |
|---|---|---|---|
| 6,143,464 | A | 11/2000 | Kawauchi |
| 6,294,311 | B1 | 9/2001 | Shimazu et al. |
| 6,352,811 | B1 | 3/2002 | Patel et al. |
| 6,352,812 | B1 | 3/2002 | Shimazu et al. |
| 6,358,669 | B1 | 3/2002 | Savariar-Hauck et al. |
| 6,475,692 | B1 | 11/2002 | Jarek et al. |
| 6,525,152 | B1 | 2/2003 | Jarek |
| 6,534,238 | B1 | 3/2003 | Savariar-Hauck et al. |
| 6,555,291 | B1 | 4/2003 | Hauck |
| 6,645,689 | B1 | 11/2003 | Jarek |
| 6,723,490 | B1 | 4/2004 | Patel et al. |

FOREIGN PATENT DOCUMENTS

| | | | |
|---|---|---|---|
| EP | 0908307 | A2 | 4/1999 |
| EP | 0908784 | A1 | 4/1999 |
| EP | 0984622 | A2 | 3/2000 |
| EP | 1023994 | A1 | 8/2000 |
| EP | 0864420 | B1 | 5/2001 |
| EP | 0908305 | B1 | 11/2001 |
| EP | 0950518 | B1 | 1/2002 |
| EP | 0940266 | B1 | 6/2002 |
| EP | 0960728 | B1 | 5/2003 |
| JP | 11-119419 | | 4/1999 |
| JP | 2000-330265 | | 11/2000 |
| JP | 2001-042509 | | 2/2001 |
| JP | 2001-042510 | | 2/2001 |

*Primary Examiner*—Barbara L. Gilliam
(74) *Attorney, Agent, or Firm*—RatnerPrestia

(57) ABSTRACT

Multilayer, positive working, thermally imageable, bakeable imageable elements are disclosed. The elements have a substrate, an underlayer, and a top layer. The underlayer comprises a resin or resins having activated methylol and/or activated alkylated methylol groups, such as a resole resin, and a polymeric material that comprises, in polymerized form about 5 mol % to about 30 mol % of methacrylic acid; about 20 mol % to about 75 mol % of N-phenylmaleimide, N-cyclohexylmaleimide, N-benzylmaleimide, or a mixture thereof; optionally, about 5 mol % to about 50 mol % of methacrylamide; and about 3 mol % to about 50 mol % of a compound represented by the formula:

$$CH_2C(R_2)C(O)NHCH_2OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl. The elements produce bakeable lithographic printing plates that are resistant to press chemistries.

41 Claims, No Drawings

MULTILAYER IMAGEABLE ELEMENTS

FIELD OF THE INVENTION

The invention relates to lithographic printing. In particular, this invention relates to multi-layer, positive-working, thermally imageable elements that are useful in forming lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask, which has clear and opaque regions. Imaging takes place in the regions under the clear regions of the mask but does not occur in the regions under the opaque regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging, which obviates the need for imaging through a mask, is becoming increasingly important in the printing industry. Imageable elements for the preparation of lithographic printing plates have been developed for use with infrared lasers. Thermally imageable, multi-layer elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811; Savariar-Hauck, U.S. Pat. No. 6,358,669, and U.S. Pat. No. 6,528,228; and Kitson, U.S. Published Patent Application No. 2004/0067432 A1; the disclosures of which are all incorporated herein by reference.

Despite the progress in thermally imageable elements, there is a desire for positive working, thermally imageable elements that are both bakable and resistant to press chemistries, such as inks, fountain solution, and the solvents used in washes, such as UV washes. Bakability is highly desirable because baking increases the press runlength.

SUMMARY OF THE INVENTION

The invention is a positive-working, thermally imageable element that is resistant to press chemistry and can be baked to increase press runlength. The imageable element comprises:

a substrate;

an underlayer over the substrate; and a top layer over the underlayer;

in which:

the element comprises a photothermal conversion material;

the top layer is substantially free of the photothermal conversion material;

the top layer is ink receptive; before thermal imaging, the top layer is not removable by an alkaline developer;

after thermal imaging to form imaged regions in the top layer, the imaged regions are removable by the alkaline developer;

the underlayer is removable by the alkaline developer, and the underlayer comprises:

(i) a polymeric material that comprises, in polymerized form:

about 5 mol % to about 30 mol % of methacrylic acid;

about 20 mol % to about 75 mol % of N-phenylmaleimide, N-cyclohexylmaleimide, N-benzylmaleimide, or a mixture thereof, preferably N-phenylmaleimide;

optionally, about 5 mol % to about 50 mol % of methacrylamide; and about 3 mol % to about 50 mol % of a compound (a), represented by the formula:

$$CH_2C(R_2)C(O)NHCH_2OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl; and (ii) a resin having activated methylol or activated alkylated methylol groups.

The resin having activated methylol and/or activated alkylated methylol groups is preferably a resole resin.

The underlayer may additionally comprise (1) a first added copolymer or (2) the first added copolymer, and a second added copolymer. The first added copolymer is a copolymer of N-phenylmaleimide; methacrylamide; acrylonitrile; and compound (b), represented by the formula:

$$CH_2C(R_4)CO_2CH_2CH_2NH—CO—NH\text{-}p\text{-}C_6H_4—R_3,$$

in which $R_3$ is OH, COOH, or $SO_2NH_2$; and $R_4$ is H or methyl;

and, optionally, 1 to 30 wt %, preferably when present 3 to 20 wt % of compound (c) represented by the formula:

$$CH_2C(R_6)CONH\text{-}p\text{-}C_6H_4—R_5$$

in which $R_5$ is OH, COOH, or $SO_2NH_2$; and $R_6$ is H or methyl.

The second added copolymer is a copolymer of N-phenylmaleimide, methacrylamide, and methacrylic acid.

In another aspect, the invention is a method for forming an image by imaging and developing the imageable element. In yet another aspect, the invention is an image useful as a lithographic printing plate formed by imaging and developing the imageable element.

The imageable elements are positive working thermally imageable multi-elements that are resistant to the press chemistries used in lithographic printing, especially in printing processes using ultraviolet-curing inks, where rinsing agents with a high content of esters, ethers or ketones are used. In addition, they can be baked to increase press run length.

DETAILED DESCRIPTION OF THE INVENTION

Unless the context indicates otherwise, in the specification and claims, the terms binder, resole resin, surfactant, dissolution inhibitor, novolac resin, compound (a), photothermal conversion material, polymeric material, first added copolymer, second added copolymer, coating solvent, and similar terms also include mixtures of such materials. Unless otherwise specified, all percentages are percentages by weight. Thermal imaging refers to imaging with a hot body, such as a thermal head, or with infrared radiation.

The invention is an imageable element useful as precursor for a lithographic printing plate. The imageable element comprises a substrate with a hydrophilic surface, an underlayer, and a top layer. A photothermal conversion material is present, either in the underlayer and/or in a separate absorber layer.

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a cylinder in a printing press, typically about 100 μm to about 600 μm. Typically, the substrate comprises an interlayer between the aluminum support and the underlayer. The interlayer may be formed by treatment of the aluminum support with, for example, silicate, dextrine, hexafluorosilicic acid, phosphate/fluoride, polyvinyl phosphonic acid (PVPA) or vinyl phosphonic acid copolymers.

The back side of the support (i.e., the side opposite the underlayer and top layer) may be coated with an antistatic agent and/or a slipping layer or matte layer to improve handling and "feel" of the imageable element.

Underlayer

The underlayer comprises a polymeric material that, after baking, surprisingly provides resistance to solvents and common printing room chemicals, such as fountain solution, inks, plate cleaning agents, rejuvenators, and rubber blanket washing agents, as well as to alcohol substitutes, which are used in fountain solutions. The underlayer also is resistant to rinsing agents with a high content of esters, ethers, and ketones, which are used with ultraviolet curable inks.

The underlayer is between the hydrophilic surface of the substrate and the top layer. After imaging, it is removed by the developer in the imaged regions to reveal the underlying hydrophilic surface of the substrate. The underlayer comprises a polymeric material that is preferably soluble in the developer to prevent sludging of the developer. In addition, the polymeric material is preferably insoluble in the solvent used to coat the top layer so that the top layer can be coated over the underlayer without dissolving the underlayer. Other ingredients, such as resins that have activated methylol and/or activated alkylated methylol groups, added copolymers, photothermal conversion materials, and surfactants, may also be present in the underlayer.

The polymeric materials used in the underlayer are copolymers that comprise, in polymerized form, about 5 mol % to about 30 mol %, preferably about 10 mol % to about 30 mol % of methacrylic acid; about 20 mol % to about 75 mol %, preferably about 35 mol % to about 60 mol % of N-phenylmaleimide; N-cyclohexylmaleimide, or a mixture thereof, preferably N-phenylmaleimide; optionally, about 5 mol % to about 50 mol %, preferably when present about 15 mol % to about 40 mol % of methacrylamide; and about 3 mol % to about 50 mol %, preferably about 10 mol % to about 40 mol % of one or more monomers of the structure:

$$CH_2{=}C(R_2){-}C(O){-}NH{-}CH_2{-}OR_1;$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl. Methods of preparation of certain of these polymeric materials are disclosed in Jarek, U.S. Pat. No. 6,475,692, the disclosure of which is incorporated herein by reference.

$R_1$ is $C_1$ to $C_{12}$ alkyl, preferably $C_1$ to $C_4$ alkyl, phenyl, $C_1$ to $C_{12}$ substituted phenyl, $C_1$ to $C_{12}$ aralkyl, or $Si(CH_3)$. Typical $C_1$ to $C_{12}$ alkyl groups are 2-methylbutyl, 3-methylbutyl, pentyl, hexyl, heptyl, octyl, nonyl, decyl, undecyl, dodecyl, 4-methylpentyl, 3-methylpentyl, 2-methylpentyl, 2-methylhexyl, 2-ethylpentyl, 5-methylhexyl, 2,2,4-trimethylpentyl, cyclopentyl, cyclohexyl, and alkyl groups of one to four carbon atoms, such as methyl, ethyl, i-propyl, n-propyl, cyclopropyl, cyclobutyl, i-butyl, s-butyl, t-butyl, and n-butyl. Typical $C_1$ to $C_{12}$ substituted phenyl groups are p-methylphenyl, m-methylphenyl, o-methylphenyl, p-methoxyphenyl, m-methoxyphenyl, o-methoxyphenyl, p-ethoxyphenyl, p-ethylphenyl, p-i-propylphenyl, p-chlorophenyl, p-bromophenyl, p-cyanophenyl, m-cyanophenyl, p-fluorophenyl, p-nitrophenyl, p-thiomethoxyphenyl, p-(N, N-dimethylamino)phenyl, pentafluorophenyl, pentachlorophenyl, p-trifluoromethylphenyl, 3,5-dichlorophenyl, 3,5-dimethylphenyl, 3,5-diethylphenyl, and 2,4,6-trimethylphenyl. Typical $C_1$ to $C_{12}$ aralkyl groups are benzyl, 1-phenylethyl, 2-phenylethyl, 1-phenylpropyl, and 3-phenyl propyl.

Preferably, $R_1$ is an alkyl group of one to four carbon atoms, phenyl, benzyl, 2-phenylethyl, or trimethylsilyl. Preferred alkyl groups of one to four carbon atoms are i-butyl, s-butyl, t-butyl, and n-butyl.

$R_2$ is hydrogen or methyl, preferably methyl.

The polymeric material comprises about 20 mol % to about 75 mol %, preferably about 35 mol % to about 60 mol %, of N-phenylmaleimide, N-cyclohexylmaleimide, N-benzylmaleimide, or a mixture thereof. N-Phenylmaleimide is preferred.

The underlayer also comprises a resin or resins having activated methylol and/or activated alkylated methylol groups. Such resins include, for example: resole resins and their alkylated analogs; methylol melamine resins and their alkylated analogs, for example melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL® resins (Dyno Cyanamid Co., Ltd.) and NIKALAC® resins (Sanwa Chemical Co., Ltd.).

The resin or resins having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Additionally, the underlayer may comprise a first added copolymer. The first added copolymer comprises, in polymerized form, about 1 to about 30 wt %, preferably about 3 to about 20 wt %, more preferably about 5 wt % of N-phenylmaleimide; about 1 to about 30 wt %, preferably about 5 to about 20 wt %, more preferably about 10 wt % of methacrylamide, about 20 to about 75 wt %, preferably about 35 to about 60 wt % of acrylonitrile and about 20 to about 75 wt %, preferably about 35 to about 60 wt % of:

$$CH_2{=}C{-}(R_4){-}CO_2{-}CH_2CH_2{-}NH{-}CO{-}NH\text{-}p\text{-}C_6H_4{-}R_3$$

in which $R_3$ is OH, COOH, or $SO_2NH_2$; and $R_4$ is H or methyl;

and, optionally, about 1 to about 30 wt %, preferably when present about 3 to about 20 wt % of $$CH_2{=}C(R_6){-}CO{-}NH\text{-}p\text{-}C_6H_4{-}R_5$$

in which $R_5$ is OH, COOH, or $SO_2NH_2$; and $R_6$ is H or methyl.

Additionally, the underlayer may also comprise a second added copolymer. The second added copolymer comprises, in polymerized form, N-phenylmaleimide, methacrylamide, and methacrylic acid. These copolymers comprise about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. These copolymers are disclosed in Shimazu, U.S. Pat. No. 6,294,311, and Savariar-Hauck, U.S. Pat. No. 6,528,228, the disclosures of which are incorporated herein by reference.

The polymeric materials and the added copolymers can be prepared by methods, such as free radical polymerization, which are well known to those skilled in the art and which are described, for example, in Chapters 20 and 21, of *Macromolecules, Vol.* 2, 2nd Ed., H. G. Elias, Plenum, New York, 1984. Useful free radical initiators are peroxides such as benzoyl peroxide (BPO), hydroperoxides such as cumyl hydroperoxide and azo compounds such as 2,2'-azobis (isobutyronitrile) (AIBN). Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

When a photothermal conversion material is present, it typically comprises about comprises 0.1 wt % to about 25 wt %, preferably about 5 wt % to about 20 wt %, more preferably about 10 wt % to 15 wt %, of the underlayer, based on the total weight of the underlayer. When a surfactant is present in the underlayer, it typically comprises 0.05 wt % to about 1 wt %, preferably about 0.1 wt % to about 0.6 wt %, more preferably about 0.2 wt % to 0.5 wt %, based on the total weight of the underlayer. The resole resin typically comprises about 7 wt % to about 15 wt %, preferably about 8 wt % to about 12 wt %, more preferably about 10 wt % of the underlayer, based on the total weight of the underlayer.

When the underlayer does not comprise either the first or second added copolymers, the underlayer typically comprises the resole resin, the photothermal conversion material, optionally the surfactant, and about 60 wt % to 90 wt %, preferably about 65 wt % to 80 wt %, of the polymeric material. When the photothermal conversion material is not present, the underlayer typically comprises the resole resin, optionally the surfactant, and about 85 wt % to 93 wt %, preferably about 88 wt % to 92 wt % of the polymeric material.

When the first added copolymer is present, the underlayer typically comprises the resole resin, the photothermal conversion material, optionally the surfactant, about 40 wt % to 80 wt %, preferably about 50 wt % to 70 wt %, of the polymeric material, and about 5 wt % to 25 wt %, preferably about 10 wt % to 20 wt %, of the first added copolymer. When the photothermal conversion material is not present, the underlayer typically comprises the resole resin, optionally the surfactant, and about 60 wt % to 85 wt %, preferably about 65 wt % to 80 wt % of the polymeric material, and about 5 wt % to 30 wt %, preferably about 10 wt % to 25 wt %, of the first added copolymer.

When the first added copolymer and the second added copolymer are present, the underlayer typically comprises the resole resin, the photothermal conversion material, optionally the surfactant, about 15 wt % to 45 wt %, preferably about 20 wt % to 40 wt %, of the polymeric material, about 5 wt % to 25 wt %, preferably about 10 wt % to 20 wt %, of the first added copolymer, and about 15 wt % to 45 wt %, preferably about 20 wt % to 40 wt %, of the second added copolymer. When the photothermal conversion material is not present, the underlayer typically comprises the resole resin, optionally the surfactant, and about 15 wt % to 50 wt %, preferably about 20 wt % to 45 wt % of the polymeric material, about 5 wt % to 30 wt %, preferably about 10 wt % to 20 wt %, of the first added copolymer, and about 15 wt % to 50 wt %, preferably about 20 wt % to 45 wt %, of the second added copolymer.

Top Layer

The top layer is over the underlayer. The top layer becomes soluble or dispersible in the developer following thermal exposure. It typically comprises an ink-receptive polymeric material, known as the binder, and a dissolution inhibitor. Alternatively, or additionally, the polymeric material comprises polar groups and acts as both the binder and dissolution inhibitor.

Any top layer used in multi-layer thermally imageable elements may be used with in the imageable elements of the invention. These are described for example in Savariar-Hauck, U.S. Pat. No. 6,3358,669, the disclosure of which is incorporated herein by reference, and Hauck, U.S. Pat. No. 6,555,291, the disclosure of which is incorporated herein by reference.

Preferably, the binder in the top layer is a light-stable, water-insoluble, developer-soluble, film-forming phenolic resin. Phenolic resins have a multiplicity of phenolic hydroxyl groups, either on the polymer backbone or on pendent groups. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. They are typically prepared by the condensation reaction of a phenol, such as phenol, m-cresol, ocresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-resol, mixtures of m-cresol and p-cresol, or phenol with formaldehyde using conventional conditions.

A solvent soluble novolac resin is one that is sufficiently soluble in a coating solvent to produce a coating solution that can be coated to produce a top layer. In some cases, it may be desirable to use a novolac resin with the highest weight average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Top layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable. Top layers comprising these resins are disclosed in Kitson, U.S. Published Patent Application No. 2004/0067432 A1, the disclosure of which is incorporated herein by reference.

The top layer typically comprises a dissolution inhibitor, which functions as a solubility-suppressing component for the binder. Dissolution inhibitors have polar functional groups that are believed to act as acceptor sites for hydrogen bonding with the hydroxyl groups present in the binder. The acceptor sites comprise atoms with high electron density, preferably selected from electronegative first row elements, especially carbon, nitrogen, and oxygen. Dissolution inhibitors that are soluble in the developer are preferred.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors.

The dissolution inhibitor may be a monomeric and/or polymeric compound that comprises a diazobenzoquinone moiety and/or a diazonaphthoquinone moiety. Other useful dissolution inhibitors are triarylmethane dyes, such as ethyl violet, crystal violet, malachite green, brilliant green, Victoria blue B, Victoria blue R, Victoria blue BO, BASONYL® Violet 610, and D11 (PCAS, Longjumeau, France). These dyes can also act as contrast dyes, which distinguish the unimaged regions from the imaged regions in the developed imageable element.

When a dissolution inhibitor is present in the top layer, it typically comprises at least about 0.1 wt %, typically about 0.5 wt % to about 30 wt %, preferably about 1 wt % to 15 wt %, based on the dry weight of the layer.

Alternatively, or additionally, the polymeric material in the top layer can comprise polar groups that act as acceptor sites for hydrogen bonding with the hydroxy groups present in the polymeric material and, thus, act as both the polymeric material and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

Photothermal Conversion Material

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include, for example, dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer are preferred. The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphtho-quinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogeno-pyryloarylidene and bis(chalcogenopyrylo) polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectralR 830A and SpectralR 840A (Spectra Colors), as well as IR Dye A, and IR Dye B, whose structures are shown below.

IR Dye A

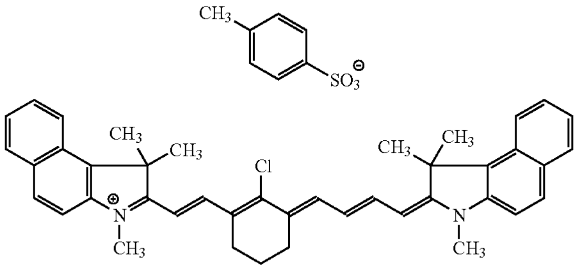

IR Dye B

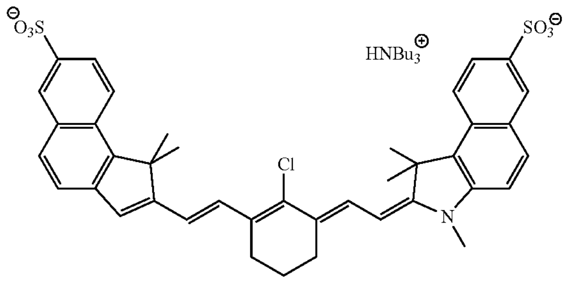

To prevent ablation during imaging with infrared radiation, the top layer is substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

The amount of infrared absorber is generally sufficient to provide an optical density of at least 0.05, and preferably, an optical density of from about 0.5 to at least about 2 to 3 at the imaging wavelength. As is well known to those skilled in the art, the amount of compound required to produce a particular optical density can be determined from the thickness of the underlayer and the extinction coefficient of the infrared absorber at the wavelength used for imaging using Beers law.

Other Layers

When an absorber layer is present, it is between the top layer and the underlayer. The absorber layer preferably consists essentially of the photothermal conversion material and, optionally, a surfactant. It may be possible to use less of the photothermal conversion material if it is present in a separate absorber layer. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055, the disclosure of which is incorporated herein by reference.

To further minimize migration of the infrared absorber from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Preparation of the Imageable Element

The imageable element may be prepared by sequentially applying the underlayer over the hydrophilic surface of the substrate; applying the absorber layer or the barrier layer if present, over the underlayer; and then applying the top layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, butyrolactone, and water, from mixtures of diethyl ketone, water, methyl lactate, and butyrolactone; and from mixtures of diethyl ketone, water, and methyl lactate.

When neither a barrier layer nor an absorber layer is present, the top layer is coated on the underlayer. To prevent the underlayer from dissolving and mixing with the top layer, the top layer should be coated from a solvent in which the underlayer layer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from diethyl ketone, or from mixtures of diethyl ketone and 1-methoxy-2-propyl acetate. An intermediate drying step, i.e., drying the underlayer, if present, to remove coating solvent before coating the top layer over it, may also be used to prevent mixing of the layers.

Alternatively, the underlayer, the top layer or both layers may be applied by conventional extrusion coating methods from a melt mixture of layer components. Typically, such a melt mixture contains no volatile organic solvents.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Bumaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. Development of the imaged element to form a printing plate, or printing form, converts the latent image to an image by removing the imaged regions, revealing the hydrophilic surface of the underlying substrate.

Suitable developers depend on the solubility characteristics of the ingredients present in the imageable element. The developer may be any liquid or solution that can penetrate and remove the imaged regions of the imageable element without substantially affecting the complementary unimaged regions. While not being bound by any theory or explanation, it is believed that image discrimination is based on a kinetic effect. The imaged regions of the top layer are removed more rapidly in the developer than the unimaged regions. Development is carried out for a long enough time to remove the imaged regions of the top layer and the underlying regions of the other layer or layers of the element, but not long enough to remove the unimaged regions of the top layer. Hence, the top layer is described as being "not removable" by, or "insoluble" in, the developer prior to imaging, and the imaged regions are described as being "soluble" in, or "removable" by, the developer because they are removed, i.e. dissolved and/or dispersed, more rapidly in the developer than the unimaged regions. Typically, the underlayer is dissolved in the developer and the top layer is dissolved and/or dispersed in the developer.

High pH developers can be used. High pH developers typically have a pH of at least about 11, more typically at least about 12, even more typically from about 12 to about 14. High pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture. Preferred hydroxides are ammonium, sodium, lithium and, especially, potassium hydroxides. The alkali metal silicate has a $SiO_2$ to $M_2O$ weight ratio of at least 0.3 (where M is the alkali metal), preferably this ratio is from 0.3 to 1.2, more preferably 0.6 to 1.1, most preferably 0.7 to 1.0. The amount of alkali metal silicate in the developer is at least 20 g $SiO_2$ per 100 g of composition and preferably from 20 to 80 g, most preferably it is from 40 to 65 g. High pH developers can be used in an immersion processor. Typical high pH developers include PC9000, PC3000, Goldstar™, Greenstar™, ThermalPro™, PROTHERM®, MX 1813, and MX1710, aqueous alkaline developers, all available from Kodak Polychrome Graphics LLC. Another useful developer contains 200 parts of Goldstamm developer, 4 parts of polyethylene glycol (PEG) 1449, 1 part of sodium metasilicate pentahydrate, and 0.5 part of TRITON® H-22 surfactant (phosphate ester surfactant).

Alternatively, the imaged imageable elements can be developed using a solvent based developer in an immersion processor or a spray on processor. Typical commercially available solvent based developers include 956 Developer, 955 Developer and SP200 (Kodak Polychrome Graphics, Norwalk, Conn., USA). Commercially available spray on processors include the 85 NS (Kodak Polychrome Graphics). Commercially available immersion processors include the Mercury™ Mark V processor (Kodak Polychrome Graphics); the Global Graphics Titanium processor (Global Graphics, Trenton, N.J., USA); and the Glunz and Jensen Quartz 85 processor (Glunz and Jensen, Elkwood, Va., USA).

Following development, the resulting printing plate is rinsed with water and dried. Drying may be conveniently carried out by infrared radiators or with hot air. After drying, the printing plate may be treated with a gumming solution comprising one or more water-soluble polymers, for example polyvinylalcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A preferred material is gum arabic.

The developed and gummed plate is baked to increase the press runlength of the plate. Baking can be carried out, for example, at about 220° C. to about 260° C. for about 5 minutes to about 15 minutes, or at a temperature of about 110° C. to about 130° C. for about 25 to about 35 min.

Industrial Applicability

The imageable elements of the invention are a multi-layer, positive working, thermally imageable, bakeable lithographic printing precursors that produce lithographic printing plates that have a long press runlength and are resistant to press chemistries. They are especially useful for use with ultraviolet curable inks, in which aggressive washes that contain organic solvents (UV wash) are used. Once a lithographic printing plate precursor has been imaged and developed to form a lithographic printing plate, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving material (such as cloth, paper, metal, glass or plastic) either directly or indirectly using an offset printing blanket to provide a desired impression of the image thereon.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

| | |
|---|---|
| BC | 1-Butoxyethanol (BUTYL CELLOSOLVE ®) |
| BYK-307 | Polyethoxylated dimethylpolysiloxane copolymer (BYK Chemie, Wallingford, CT, USA |
| CREO ® Trendsetter 3230 | Commercially available platesetter, using Procom Plus software and operating at a wavelength of 830 nm (Creo Products, Burnaby, BC, Canada) |
| Copolymer 1 | Copolymer containing 5 wt % N-phenylmaleimide, 10 wt % methacrylamide, 45 wt % acrylonitrile; and 40 wt % $CH_2C(CH_3)CO_2CH_2CH_2$—NH—CO—NH-p-$C_6H_4$—OH |
| Copolymer 2 | Copolymer containing 5 wt % N-phenylmaleimide, 10 wt % methacrylamide, 6 wt % benzoic acid methacrylamide, 48 wt % acrylonitrile, and 31 wt % $CH_2C(CH_3)CO_2CH_2CH_2$—NH—CO—NH-p-$C_6H_4$—OH |
| DAA | Diacetone alcohol |
| ELECTRA EXCEL ® | Thermally sensitive, positive working, single layer, conditioned, inhibited novolac-containing plate printing plate precursor (Kodak Polychrome Graphics, Norwalk, CT, USA). |
| Ethyl violet | C.I. 42600; CAS 2390-59-2 ($lambda_{max}$ = 596 nm) $[(p-(CH_3CH_2)_2NC_6H_4)_3C^+Cl^-]$ (Aldrich, Milwaukee, WI, USA) |
| IR Dye A | Infrared absorbing dye ($lambda_{max}$ = 830 nm) (Eastman Kodak, Rochester, NY, USA) (see structure above) |
| N-13 | Novolac resin; 100% m-cresol; MW 13,000 (Eastman Kodak Rochester, NY, USA) |
| Resole resin | GP649D99 (Georgia-Pacific, Atlanta, GA, USA) |
| Substrate A | 0.3 gauge, aluminum sheet which had been electrograined, anodized and treated with a solution of sodium dihydrogen phosphate/sodium fluoride |

Example 1

This example illustrates preparation of a copolymer containing 41.5 mol % N-phenylmaleimide, 21 mol % methacrylic acid, and 37.5 mol % N-(iso butoxymethyl) acrylamide.

N-Phenylmaleimide (19.31 g), methacrylic acid (4.86 g), N-(iso-butoxymethyl)acrylamide (15.84 g) (Cytec Industries, Charlotte, N.C., USA), and 50:50 (v:v) dioxolane/ethanol (126.01 g) were placed in a 1 L reaction kettle fitted with a reflux condenser, nitrogen supply, thermometer, stirrer, and heating mantle. Nitrogen was bubbled through the reaction mixture for one hour. The reaction was heated to 60° C. under nitrogen and 2,2-azobisisobutyronitrile (AIBN) (0.054 g in 10 g of dioxolane/ethanol) was added. The reaction mixture was stirred under nitrogen at 60° C. for about 20 hr. The reaction mixture was slowly added to water (about 1 L), and the resulting precipitate filtered. The precipitate was washed with about 1 L of 80:20 ethanol/water, filtered again, and dried for two days at 50° C. Yield: 79%.

Example 2

This example illustrates preparation of a copolymer containing 41.5 mol % N-phenylmaleimide, 21 mol % methacrylic acid, 19 mol % methacryamide, and 18.5 mol % N-(isobutoxymethyl)acrylamide. The procedure of Example 1 was repeated except that N-phenylmaleimide (21.26 g), methacrylic acid (5.35 g), methacrylamide (4.78 g), N-(isobutoxymethyl)acrylamide (8.60 g) and 50:50 (v:v) dioxolane/ethanol (126.01 g) were used to prepare the copolymer. Yield: 75%.

Example 3

This example illustrates preparation of a copolymer containing 41.5 mol % N-phenylmaleimide, 21 mol % methacrylic acid, 19 mol % methacryamide, and 18.5 mol % N-(butoxymethyl)acrylamide. The procedure of Example 1 was repeated except that N-phenylmaleimide (21.26 g), methacrylic acid (5.35 g), methacrylamide (4.78 g), N-(butoxymethyl)acrylamide (8.60 g) (Cytec Industries, Charlotte, N.C., USA) and 50:50 (v:v) dioxolane/ethanol (126.01 g) were used to prepare the copolymer. Yield: 72%.

Example 4

This example illustrates preparation of a functionalized novolac resin.

N-13 (24 g, 199.75 millimoles) was added in acetone (66 g) with stirring and the resulting mixture cooled 10° C. in an ice/water bath. p-Toluene sulfonyl chloride (20.02 millimoles) at 10° C. over 1 min. Triethylamine (19.63 millimoles) was added at 10° C. over 2 min. The reaction mixture was stirred for 10 min at less than 15° C. Acetic acid (8.33 millimoles) was added at 10° C. over 10 sec, and the reaction mixture stirred for 15 min. Water/ice (160 g), and acetic acid (1.2 g, 20.02 millimoles) was added over several minutes at 15° C. and the reaction mixture stirred below 15° C. for 5 min.

The supernatant was decanted from the tacky solid that formed in the bottom of the reaction flask. Acetone (354 g) was added, and the reaction mixture stirred until a clear solution was obtained. Water/ice (160 g) and acetic acid (1.2 g, 20.02 millimoles) were added over several minutes and the reaction mixture stirred for 5 min below 15° C. The supernatant was decanted from the tacky solid. Additional acetone (354 g) was added and the reaction mixture stirred until a clear solution was obtained. 25% of the acetone solution was added to a mixture of ice (460 g), water (460 g) and acetic acid (0.5 g). The resulting mixture was stirred for 20 minutes, the precipitate allowed to settle, and the supernatant decanted. The process was repeated with the rest of the acetone solution. The damp polymer fractions were combined, washed twice with water (460 g), and dried. Yield: 88%.

Comparative Example 1

This example illustrates preparation of a copolymer containing 41.5 mol % N-phenylmaleimide, 21 mol % methacrylic acid, and 37.5% methacrylamide The procedure of Example 1 was repeated except that N-phenylmaleimide (23.59 g), methacrylic acid (5.93 g), methacrylamide (10.48 g) and dioxolane/ethanol (50:50 (v:v); 126.01 g). After precipitation of the copolymer in water, the copolymer was washed with about 1 L of 80:20 ethanol/water containing about 5 drops of concentrated hydrochloric acid, filtered again, washed with about 1 L of 80:20 ethanol/water, filtered again, and dried for two days at 50° C. Yield: 80%.

Comparative Examples 2 to 4 and Examples 5 to 10

Comparative Example 2 is an ELECTRA EXCEL® thermally sensitive, positive working, single layer, conditioned, inhibited novolac-containing plate printing plate precursor. It develops in high pH developer, is bakeable, but has poor resistance to press chemicals. Comparative Examples 3 and 4 and Examples 5 to 10 were prepared by the following procedure.

Underlayer: Coating solutions containing the components listed in Table 1 in methyl ethyl ketone/1-methoxypropan-2-ol/butyrolactone/water (65/15/10/10, w:w:w:w) were coated onto substrate A using a wire wound bar. The resulting element comprising the underlayer and the substrate was dried at 135° C. for 35 sec. The coating weight of each of the resulting underlayers was 1.3 $g/m^2$.

Top Layer A coating solution containing 99.35 parts by weight of the functionalized novolac resin prepared in Example 4, 0.3 parts by weight of ethyl violet, and 0.35 parts by weight of BYK-307 in diethyl ketone/1-methoxy-2-propyl acetate (92/8, w:w) was coated onto each underlayer, using a wire wound bar. Each resulting imageable element was dried at 135° C. for 35 seconds. The coating weight of each of the resulting top layers was 0.9 $g/m^2$.

TABLE 1

| | Example | | | | | | | |
|---|---|---|---|---|---|---|---|---|
| Component | C3 | C4 | 5 | 6 | 7 | 8 | 9 | 10 |
| | Parts by Weight | | | | | | | |
| Copolymer of Comparative Example 1 | 59.65 | 74.65 | — | — | | | | |
| Copolymer of Example 1 | — | — | 59.65 | 74.65 | | | | |
| Copolymer of Example 2 | | | | | 59.65 | 74.65 | — | — |
| Copolymer of Example 3 | | | | | — | — | 59.65 | 74.65 |
| Copolymer 1 | 15 | — | 15 | — | 15 | — | 15 | — |
| GP649D99 | 10 | 10 | 10 | 10 | 10 | 10 | 10 | 10 |
| IR Dye A | 15 | 15 | 15 | 15 | 15 | 15 | 15 | 15 |
| BYK-307 | 0.35 | 0.35 | 0.35 | 0.35 | 0.35 | 0.35 | 0.35 | 0.35 |

The imageable elements from Comparative Examples 2 to 4 (C2 to C4) and Examples 5 to 10 were evaluated with the following tests. The results are given in Table 2.

Developer drop test on underlayer only. A large drop of Goldstar™ developer was placed on the underlayer of each element at 22° C., and the time required to dissolve the layer was noted.

Developer drop test on complete imageable element. A large drop of Goldstar™ developer was placed on each imageable element at 22° C. and the time required to dissolve the layers is noted.

Cleanout and Resolution Each imageable element was imaged with 830 nm radiation with an internal test pattern (plot 0), on a CREO® 3230 Trendsetter at 100 to 180 $mJ/cm^2$, in 20 $mJ/cm^2$ increments (at 9W). Each imaged imageable element was machine processed with Goldstar™ developer in a Kodak Polychrome Graphics Mercury™ Mark V Processor (750 mm/min processing speed, 23° C. developer temperature). The resulting printing plates were evaluated for cleanout (first imaging exposure where exposed regions dissolve completely in developer) and best resolution (imaging exposure where plate performs best).

Solvent resistance drop test on complete imageable element. A large drop of either diacetone alcohol/water (80:20, v:v) or 2-butoxyethanol/water (80:20, v:v) was placed on each imageable element at 22° C. The time required to dissolve the layers was noted, and the amount of material removed after 1 min was assessed.

Baking test Each imageable elements was baked at 210° C. and 230° C. for 8 minutes in a Mathis LTE labdryer oven (Werner Mathis, Switzerland) (fan speed of 1000 rpm). After the element was baked, a 6 minute drop test was carried out with methyl lactate/diethyl ketone/butyrolactone/water (45/36/10/9, w:w) a typical coating solvent composition for this type of element, and the amount of material removed was assessed.

Deletion gel test A Kodak Polychrome Graphics positive deletion gel (contains hydrofluoric acid) was applied to the baked imageable elements for up to 3 min, and the amount of time required for removal of the baked layers was noted.

Example 11

This example illustrates preparation of a copolymer having 40 mol % N-phenylmaleimide, 25 mol % methacrylic acid, 25 mol % methacrylamide and 10 mol % N-(Isobutoxymethyl)acrylamide. The procedure of Example 1 was repeated except that N-phenylmaleimide (21.68 g), methacrylic acid (6.74 g), methacrylamide (6.66 g), N-(isobutoxymethyl)acrylamide (4.92 g) and dioxolane/ethanol (50:50 (v:v); 126.01 g) were used to prepare the copolymer. Yield: 79%

Example 12

This example illustrates preparation of a copolymer having 40 mol % N-phenylmaleimide, 25 mol % methacrylic acid, 25 mol % methacrylamide and 10 mol % N-(butoxymethyl)acrylamide. The procedure of Example 1 was repeated except that N-phenylmaleimide (21.68 g), methacrylic acid (6.74 g), methacrylamide (6.66 g), N-(butoxymethyl)acrylamide (4.92 g), and dioxolane/ethanol (50:50 (v:v); 126.01 g) were used to prepare the copolymer. Yield: 82%.

Example 13

This example illustrates preparation of a copolymer having 30 mol % N-phenylmaleimide, 20 mol % methacrylic acid, 35 mol % methacrylamide and 15 mol % N-(isobutoxymethyl)acrylamide. The procedure of Example 1 was repeated except that N-phenylmaleimide (16.96 g), methacrylic acid (5.62 g), methacrylamide (9.72 g), N-(butoxymethyl)acrylamide (7.70 g), and dioxolane/ethanol (50:50 (v:v); 126.01 g) were used to prepare the copolymer. Yield: 83%.

Examples 14 to 19

Imageable elements were prepared as in Examples 5 to 10, except that the ingredients listed in Table 3 were used in the underlayer.

TABLE 2

| | Goldstar ™ Developer Drop Test (sec) | | Minimum exposure required for ($mJ/cm^2$) | | Solvent resistance drop test (sec) | | Weight loss after 1 minute (%) | | Baked plates at 210° C. | | Baked plates at 230° C. | |
|---|---|---|---|---|---|---|---|---|---|---|---|---|
| Example | Under-layer | Complete element | Clean out | Best Resolution | DAA/water | BC/water | DAA/water | BC/water | 6 Minute drop test | Deletion gel | 6 Minute drop test | Deletion gel |
| C2 | n/a | 50 | 100 | 160 | <10 | <10 | 100 | 100 | A little coating removed | A little coating removed | No coating removed | No coating removed |
| C3 | 8 | 180 | 125 | 135 | >180 | >180 | 25 | 20 | Most coating removed | Most coating removed | A little coating removed | A little coating removed |
| C4 | 5 | 90 | 120 | 125 | >180 | >180 | 25 | 35 | All coating removed | All coating removed | All coating removed | All coating removed |
| 5 | >60 | 300 | 180 | >180 | 20 | 20 | 100 | 100 | No coating removed | No coating removed | No coating removed | No coating removed |
| 6 | >60 | 90 | 180 | >180 | 20 | 20 | 100 | 100 | No coating removed | No coating removed | No coating removed | No coating removed |
| 7 | 25 | 240 | 155 | 160 | 90 | >180 | 80 | 35 | No coating removed | No coating removed | No coating removed | No coating removed |
| 8 | 18 | 150 | 155 | 160 | 60 | 60 | 100 | 100 | A little coating removed | A little coating removed | A little coating removed | A little coating removed |
| 9 | 25 | 240 | 150 | 160 | 90 | >180 | 80 | 20 | No coating removed | A little coating removed | No coating removed | No coating removed |
| 10 | 16 | 120 | 150 | 150 | 60 | >180 | 100 | 40 | A little coating removed | A little coating removed | A little coating removed | A little coating removed |

TABLE 3

| Component | Example 14 | 15 | 16 | 17 | 18 | 19 |
|---|---|---|---|---|---|---|
| | Parts by Weight | | | | | |
| Copolymer of Example 11 | 59.65 | 74.65 | — | — | | |
| Copolymer of Example 12 | — | — | 59.65 | 74.65 | | |
| Copolymer of Example 13 | | | | | 59.65 | 74.65 |
| Copolymer 2 | 15 | — | 15 | — | 15 | — |
| GP649D99 | 10 | 10 | 10 | 10 | 10 | 10 |
| IR Dye A | 15 | 15 | 15 | 15 | 15 | 15 |
| BYK-307 | 0.35 | 0.35 | 0.35 | 0.35 | 0.35 | 0.35 |

The resulting imageable elements were evaluated as in Examples 5 to 10, except that the 6 minute drop test was not carried out and the baking test was assessed on a 10 point scale in which 1=no removal, and 10=complete removal. The results are given in Table 4.

TABLE 4

| Example | Goldstar ™ Developer Drop Test (sec) Under-layer | Complete Element | Minimum exposure required for (mJ/cm$^2$) Clean Out | Best Resolution | Solvent resistance drop test (sec) DAA/ water | BC/ water | Weight loss after 1 minute (%) DAA/ water | BC/ water | Baked plates at 210° C. Deletion gel[a] | Baked plates at 230° C. Deletion gel[a] |
|---|---|---|---|---|---|---|---|---|---|---|
| 14 | 15 | 180 | <120 | <120 | 180 | >180 | 30 | 10 | 3 | 1 |
| 15 | 5 | 60 | >120 | <120 | 180 | 180 | 35 | 30 | 5 | 3 |
| 16 | 15 | 120 | <120 | <120 | >180 | >180 | 20 | 5 | 3 | 2 |
| 17 | 5 | 80 | <120 | <120 | 180 | >180 | 30 | 15 | 5 | 3 |
| 18 | 30 | 150 | <100 | 100 | >180 | >180 | 25 | 20 | 1 | 1 |
| 19 | 5 | 90 | <100 | 100 | 180 | 180 | 30 | 40 | 4 | 1 |

[a]1 = no removal; 10 = complete removal

Having described the invention, we now claim the following and their equivalents.

What is claimed is:

1. An imageable element comprising:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer, the underlayer is removable by the alkaline developer, and the underlayer comprises:

(i) a polymeric material that comprises, in polymerized form:

about 5 mol % to about 30 mol % of methacrylic acid;

about 20 mol % to about 75 mol % of N-phenylmaleimide, N-cyclohexylmaleimide, N-benzylmaleimide, or a mixture thereof; and about 3 mol % to about 50 mol % of a compound (a), represented by the formula:

$CH_2C(R_2)C(O)NHCH_2OR_1$, in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl, and (ii) a resin having activated methylol or activated alkylated methylol groups.

2. The element of claim 1 in which the underlayer comprises about 7 wt % to about 15 wt % of the resin having activated methylol or activated alkylated methylol groups and about 15 wt % to 93 wt % the polymeric material.

3. The element of claim 1 in which the resin having activated methylol or activated alkylated methylol groups is resole resin.

4. The element of claim 3 in which the polymeric material additionally comprises about 5 mol % to about 50 mol % methacrylamide.

5. The element of claim 3 in which the underlayer comprises about 0.5 wt % to about 20 wt %, of the photothermal conversion material, about 7 wt % to about 15 wt % of the resole resin, and about 60 wt % to 90 wt % the polymeric material.

6. The element of claim 5 in which $R_1$ is $C_1$ to $C_4$ alkyl, phenyl, benzyl, 2-phenylethyl, or $Si(CH_3)_3$; and $R_2$ is methyl.

7. The element of claim 6 in which the polymeric material comprises about 10 mol % to about 30 mol % of methacrylic acid; about 35 mol % to about 60 mol % of N-phenylmaleimide; and about 10 mol % to about 40 mol % of compound (a).

8. The element of claim 7 in which the polymeric material additionally comprises about 15 mol % to about 40 mol % of methacrylamide.

9. The element of claim 7 in which the underlayer comprises about 5 wt % to about 20 wt % of the photothermal conversion material, about 8 wt % to about 12 wt % of the resole resin, and about 65 wt % to about 80 wt % the polymeric material.

10. The element of claim 3 in which:

the underlayer additionally comprises a first added copolymer, and the first added copolymer comprises about 1 wt % to about 30 wt % of N-phenylmaleimide; about 1 wt % to about 30 wt % of methacrylamide; about 20 wt % to about 75 wt % of acrylonitrile; and about 20 wt % to about 75 wt % of compound (b), represented by the formula:

$CH_2C(R_4)CO_2CH_2CH_2—NH—CO—NH\text{-}p\text{-}C_6H_4—R_3$, in which $R_3$ is OH, COOH, or $SO_2NH_2$; and $R_4$ is H or methyl.

11. The element of claim 10 in which the first added copolymer additionally comprises about 1 wt % to about 30 wt % of compound (c) represented by the formula:

$CH_2C(R_6)CO—NH\text{-}p\text{-}C_6H_4—R_5$ in which $R_5$ is OH, COOH, or $SO_2NH_2$; and $R_5$ is H or methyl.

12. The element of claim 10 in which the underlayer comprises about 0.5 wt % to about 20 wt %, of the photothermal conversion material, about 7 wt % to about 15 wt % of the resole resin, and about 40 wt % to about 80 wt % of the polymeric material, and about 5 wt % to about 25 wt % of the first added copolymer.

13. The element of claim 12 in which the polymeric material additionally comprises about 5 mol % to about 50 mol % methacrylamide.

14. The element of claim 12 in which $R_1$ is $C_1$ to $C_4$ alkyl, phenyl, benzyl, 2-phenylethyl, or $Si(CH_3)_3$; and $R_2$ is methyl.

15. The element of claim 14 in which the underlayer comprises about 5 wt % to about 20 wt % of the photothermal conversion material, about 8 wt % to about 12 wt % of the resole resin, about 50 wt % to about 70 wt % of the polymeric material, and about 10 wt % to about 20 wt %, of the first added copolymer.

16. The element of claim 15 in which the first added copolymer additionally comprises 1 wt % to 30 wt % of compound (c) represented by the formula:

$CH_2C(R_6)CO—NH\text{-}p\text{-}C_6H_4—R_5$ in which $R_5$ is OH, COOH, or $SO_2NH_2$; and $R_6$ is H or methyl.

17. The element of claim 16 in which the top layer comprises a novolac resin and a dissolution inhibitor.

18. The element of claim 10 in which:

the underlayer additionally comprises a second added copolymer, and the second added copolymer comprises about 25 mol % to about 75 mol % of N-phenylmaleimide; about 10 mol % to about 50 mol % of methacrylamide; and about 5 mol % to about 30 mol % of methacrylic acid.

19. The element of claim 18 in which compound (a) additionally comprises about 5 mol % to about 50 mol % methacrylamide.

20. The element of claim 18 in which the underlayer comprises about 0.5 wt % to about 20 wt % of the photothermal conversion material, about 7 wt % to about 15 wt % of the resole resin, about 15 wt % to about 45 wt % of the polymeric material, about 5 wt % to 25 wt % of the first added copolymer, and about 15 wt % to about 45 wt % of the second added copolymer.

21. The element of claim 20 in which $R_1$ is $C_1$ to $C_4$ alkyl, phenyl, benzyl, 2-phenylethyl, or $Si(CH_3)_3$; and $R_2$ is methyl.

22. The element of claim 21 in which the polymeric material comprises about 10 mol % to about 30 mol % of methacrylic acid; about 35 mol % to about 60 mol % of N-phenylmaleimide; and about 10 mol % to about 40 mol % of compound (a).

23. The element of claim 22 in which the polymeric material additionally comprises about 15 mol % to about 40 mol % of methacrylamide.

24. The element of claim 23 in which the first added copolymer additionally comprises about 1 wt % to about 30 wt % of compound (c) represented by the formula:

$CH_2C(R_6)CO—NH\text{-}p\text{-}C_6H_4—R_5$ in which $R_5$ is OH, COOH, or $SO_2NH_2$; and $R_6$ is H or methyl.

25. The element of claim 24 in which the top layer comprises a novolac resin and a dissolution inhibitor.

26. The element of claim 23 in which the underlayer comprises about 5 wt % to about 20 wt % of the photothermal conversion material, about 8 wt % to about 12 wt % of the resole resin, about 20 wt % to 40 wt % of the polymeric material, about 10 wt % to 20 wt % of the first added copolymer, and about 20 wt % to 40 wt % of the second added copolymer.

27. The element of claim 3 additionally comprising an absorber layer between the underlayer and the top layer, the absorber layer consisting essentially of the photothermal conversion material.

28. The element of claim 27 in which the underlayer comprises about 7 wt % to about 15 wt % of the resole resin, and about 15 wt % to 93 wt % the polymeric material.

29. The element of claim 28 in which $R_1$ is $C_1$ to $C_4$ alkyl, phenyl, benzyl, 2-phenylethyl, or $Si(CH_3)_3$; and $R_2$ is methyl.

30. The element of claim 29 in which the polymeric material additionally comprises about 5 mol % to about 50 mol % methacrylamide.

31. The element of claim 1 in which the polymeric material additionally comprises about 5 mol % to about 50 mol % methacrylamide.

32. The element of claim 31 in which $R_1$ is $C_1$ to $C_4$ alkyl, phenyl, benzyl, 2-phenylethyl, or $Si(CH_3)_3$; and $R_2$ is methyl.

33. A method for forming an image, the method comprising the steps of:

a) thermally imaging a multi-layer imageable element and forming an imaged imageable element comprising imaged and complementary unimaged regions;

wherein the imageable element comprises:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the underlayer comprises:

(i) a polymeric material that comprises, in polymerized form:

about 5 mol % to about 30 mol % of methacrylic acid;

about 20 mol % to about 75 mol % of N-phenylmaleimide, N-cyclohexylmaleimide, N-benzylmaleimide, or a mixture thereof; and about 3 mol % to about 50 mol % of a compound represented by the formula:

$CH_2C(R_2)C(O)NHCH_2OR_1$, in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl, and (ii) a resin having activated methylol or activated alkylated methylol groups, b) developing the imaged imageable element with the developer and removing the imaged regions without substantially affecting the unimaged regions.

34. The method of claim 33 wherein the underlayer additionally comprises a first added copolymer and a second added copolymer wherein the first added copolymer comprises about 1 wt % to about 30 wt % of N-phenylmaleimide; about 1 wt % to about 30 wt % of methacrylamide; about 20 wt % to about 75 wt % of acrylonitrile; and about 20 wt % to about 75 wt % of compound (b), represented by the formula:

$CH_2C(R_4)CO_2CH_2CH_2—NH—CO—NH\text{-}p\text{-}C_6H_4—R_3$, in which $R_3$ is OH, COOH, or $SO_2NH_2$; and $R_4$ is H or methyl and the second added copolymer comprises about 25 mol % to about 75 mol % of N-phenylmaleimide; about 10 mol % to about 50 mol % of methacrylamide; and about 5 mol % to about 30 mol % of methacrylic acid.

35. The method of claim 34 in which the underlayer comprises about 0.5 wt % to about 20 wt % of the photothermal conversion material, about 7 wt % to about 15 wt % of the of the resin having activated methylol or activated alkylated methylol groups, about 15 wt % to about 45 wt % of the polymeric material, about 5 wt % to 25 wt % of the first added copolymer, and about 15 wt % to about 45 wt % of the second added copolymer.

36. The method of claim 35 additionally comprising the step of baking the imaged imageable element after step b).

37. The method of claim 36 in which the underlayer comprises about 7 wt % to about 15 wt % of the resin having activated methylol or activated alkylated methylol groups, and about 15 wt % to 93 wt % the polymeric material.

38. The method of claim 36 in which the resin having activated methylol or activated alkylated methylol groups is resole resin.

39. The method of claim 38 in which $R_1$ is $C_1$ to $C_4$ alkyl, phenyl, benzyl, 2-phenylethyl, or $Si(CH_3)_3$; and $R_2$ is methyl.

40. The method of claim 39 in which the polymeric material additionally comprises about 5 mol % to about 50 mol % methacrylamide.

41. An image formed by the method of claim 36.

* * * * *